United States Patent
Kawa et al.

(10) Patent No.: US 7,679,872 B2
(45) Date of Patent: Mar. 16, 2010

(54) ELECTROSTATIC-DISCHARGE PROTECTION USING A MICRO-ELECTROMECHANICAL-SYSTEM SWITCH

(75) Inventors: Jamil Kawa, Campbell, CA (US); Subarnarekha Sinha, Menlo Park, CA (US); Min-Chun Tsai, San Jose, CA (US); ZongWu Tang, Pleasanton, CA (US); Qing Su, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/176,801

(22) Filed: Jul. 21, 2008

(65) Prior Publication Data
US 2010/0014199 A1  Jan. 21, 2010

(51) Int. Cl.
*H02H 9/04* (2006.01)
*H02H 9/00* (2006.01)

(52) U.S. Cl. ..................................................... 361/56
(58) Field of Classification Search .................... 361/56
See application file for complete search history.

(56) References Cited

U.S. PATENT DOCUMENTS

| | | | | |
|---|---|---|---|---|
| 5,946,176 A | * | 8/1999 | Ghoshal | 361/56 |
| 6,239,685 B1 | * | 5/2001 | Albrecht et al. | 337/365 |
| 6,275,361 B1 | * | 8/2001 | Wallash et al. | 360/323 |
| 6,504,447 B1 | * | 1/2003 | Laney et al. | 333/17.2 |
| 6,813,122 B1 | * | 11/2004 | Granstrom | 360/323 |
| 6,847,266 B2 | * | 1/2005 | Laney et al. | 333/12 |
| 2005/0115811 A1 | | 6/2005 | Receveur | |

* cited by examiner

*Primary Examiner*—Ronald W Leja
(74) *Attorney, Agent, or Firm*—Park, Vaughan & Fleming LLP

(57) ABSTRACT

Embodiments of an interface circuit are described. This interface circuit includes an input pad, a control node and a transistor, which has three terminals. A first terminal is electrically coupled to the input pad and a second terminal is electrically coupled to the control node. Moreover, the interface circuit includes a micro-electromechanical system (MEMS) switch, which is electrically coupled to the input pad and the control node, where the MEMS switch is in parallel with the transistor. In the absence of a voltage applied to a control terminal of the MEMS switch, the MEMS switch is closed, thereby electrically coupling the input pad and the control node. Furthermore, when the voltage is applied to the control terminal of the MEMS switch, the MEMS switch is open, thereby electrically decoupling the input pad and the control node.

22 Claims, 9 Drawing Sheets

⌐ 700

ELECTRICALLY COUPLE TWO TERMINALS OF A TRANSISTOR TO EACH OTHER VIA A CLOSED *MEMS* SWITCH, WHICH IS IN PARALLEL WITH THE TRANSISTOR, IN THE ABSENCE OF A VOLTAGE APPLIED TO A CONTROL TERMINAL OF THE *MEMS* SWITCH, WHERE THE CLOSED *MEMS* SWITCH ELECTRICALLY COUPLES AN INPUT PAD IN AN INTERFACE CIRCUIT TO A CONTROL NODE
710

APPLY THE VOLTAGE TO THE *MEMS* SWITCH TO OPEN THE *MEMS* SWITCH, THEREBY ELECTRICALLY DECOUPLING THE TWO TERMINALS OF THE TRANSISTOR AND ELECTRICALLY DECOUPLING THE INPUT PAD AND THE CONTROL NODE, WHEN A SUPPLY VOLTAGE IS PROVIDED TO THE INTERFACE CIRCUIT
712

FIG. 7

ELECTROSTATIC-DISCHARGE PROTECTION USING A MICRO-ELECTROMECHANICAL-SYSTEM SWITCH

BACKGROUND

1. Field of the Invention

Embodiments of the present invention relate to circuits. More specifically, embodiments of the present invention relate to a method and a circuit for protecting circuits from electrostatic discharge.

2. Related Art

A major reliability problem for many integrated circuits (ICs) is electrostatic discharge (ESD). During an ESD event, a large amount of charge is transferred from one object (such as a person, a transmission line or a piece of metal) to another (such as an IC) in a relatively short period of time, which results in a peak current that can cause significant damage to the IC. For example, ESD damage can include: gate-oxide breakdown, void formation in the gate oxide, and/or melting and vaporization of interconnects. Note that a common model used for testing the resilience of an IC to an ESD event is the human body model in which the IC under test has to withstand a peak current of 1.3 A with a rise time of 10-30 ns. Another widely used ESD requirement is the ability of ICs to withstand 2000 V on any pin.

FIG. 1 presents a block diagram illustrating an existing interface circuit 100, such as an input/output circuit. In this circuit, ESD may be injected via input pad 110. While such an event can damage either or both of transistors 112, n-type pull-down transistor 112-2 is typically more sensitive to ESD. This transistor is further described in FIG. 2, which presents a block diagram illustrating parasitic effects in an existing interface circuit 200. Note that there are two 'parasitic' devices in this circuit associated with n-type transistor 112-2, including: the lateral npn bipolar transistor across the n-channel and the reverse diode between the drain (input pad 110) and the substrate 210 (ground), i.e., between the n+ region and the p substrate of n-type transistor 112-2.

In some existing CMOS interface circuits, the parasitic bipolar transistor associated with n-type transistor 112-2 provides ESD protection via a so-called 'snapback' mechanism. This is illustrated in FIG. 3, which presents a graph 300 of current 310 as a function of voltage 312 for an existing transistor. Ignoring second-order effects (such as n-gate bootstrapping), during an ESD event the snapback mechanism essentially turns on the n-channel in the n-type transistor 112-2 (FIG. 2) heavily and allows it to conduct the charge to ground. Note that the snapback mechanism provides ESD protection as long as the snap-back voltage of the n-type transistor 112-2 (FIG. 2) is smaller than the breakdown voltage $V_{CE}$ of the parasitic diode associated with the n-type transistor 112-2 (FIG. 2).

Unfortunately, as devices are scaled the gate-oxide thicknesses and pn-junction widths are decreased, which allows ESD events having less energy and lower voltages to damage or destroy ICs. Moreover, for technology having critical dimensions less than or equal to 250 nm, the breakdown voltage of the parasitic diodes becomes smaller than the snapback voltage, thereby turning the breakdown of the parasitic reverse pn junction into the primary ESD-protection device for n-type transistors, which is often not sufficient.

Consequently, additional protection circuits are often added around the input pad, output pad and power pads of ICs to provide effective ESD protection. For example, in typical interface circuits non-parasitic diodes are included for ESD protection. This is shown in FIG. 4, which presents a block diagram illustrating an existing interface circuit 400. Typically, diodes 410 have to be able to withstand the large currents that can occur during an ESD event (note that the diode across the n-type transistor acts as a shunt and drains all the current). However, using existing processes, the resulting diodes can occupy as much area as n-type transistor 112-2, which can significantly increase the cost of the IC.

Hence, there is a need for a circuit and a technique to protect circuits, such as interface circuits, from ESD without the above-described problems.

SUMMARY

One embodiment of this invention provides an interface circuit that includes an input pad, a control node and a transistor, which has three terminals. A first terminal is electrically coupled to the input pad and a second terminal is electrically coupled to the control node. Moreover, the interface circuit includes a micro-electromechanical system (MEMS) switch, which is electrically coupled to the input pad and the control node, where the MEMS switch is in parallel with the transistor. In the absence of a voltage applied to a control terminal of the MEMS switch, the MEMS switch is closed, thereby electrically coupling the input pad and the control node. Furthermore, when the voltage is applied to the control terminal of the MEMS switch, the MEMS switch is open, thereby electrically decoupling the input pad and the control node.

In some embodiments, the MEMS switch is configured to protect the transistor from electrostatic discharge (ESD).

In some embodiments, the interface circuit includes a control circuit to provide the voltage. This control circuit may provide the voltage when a supply voltage is provided to the interface circuit. Moreover, the control circuit may include a charge pump. In these embodiments, the voltage may be greater than a supply voltage of the interface circuit.

In some embodiments, the control node is configured to electrically couple to ground or a supply voltage.

Moreover, the transistor may be n-type.

In some embodiments, the interface circuit is disposed on an integrated circuit. Moreover, the MEMS switch may be disposed, at least in part, in a metal layer of the integrated circuit.

In some embodiments, the MEMS switch includes two metal contacts separated by an intervening layer. This intervening layer may have a sheet resistivity less than 5Ω/□ (ohms per square). Furthermore, the intervening layer may have a sheet resistivity greater than 2Ω/□. In some embodiments, the intervening layer includes: graphite, a salicided material, n-type silicon, p-type silicon, and/or doped polysilicon. Note that the intervening layer may prevent metal-to-metal contact in the MEMS switch.

In some embodiments, the MEMS switch includes a membrane switch architecture and/or a cantilever switch architecture. Moreover, the MEMS switch may have a vertical configuration, a horizontal configuration, or a combination of these configurations. Note that the vertical configuration is substantially aligned out of a plane of the interface circuit and the horizontal configuration is substantially aligned in the plane of the interface circuit.

In some embodiments, the MEMS switch is closed in the absence of the supply voltage applied to the interface circuit.

Another embodiment provides a computer-readable medium containing data representing the interface circuit.

Another embodiment provides the integrated circuit.

Another embodiment provides a method for protecting the transistor in the interface circuit from ESD. During this method, two terminals of the transistor are electrically coupled to each other via the closed MEMS switch, which is in parallel with the transistor, in the absence of the voltage applied to the control terminal of the MEMS switch, where the closed MEMS switch electrically couples the input pad in the interface circuit to the control node. Then, the voltage is applied to the MEMS switch to open the MEMS switch, thereby electrically decoupling the two terminals of the transistor and electrically decoupling the input pad and the control node, when the supply voltage is provided to the interface circuit.

BRIEF DESCRIPTION OF THE FIGURES

FIG. 7 is a flowchart illustrating a method for protecting a transistor in an interface circuit from electrostatic discharge (ESD) in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of an interface circuit, a method, an integrated circuit (IC) that includes the interface circuit, and a computer-readable medium containing data representing the interface circuit are described. In this interface circuit, a micro-electromechanical system (MEMS) switch may be used to protect a transistor, which is electrically coupled to an input pad and a control node (which may be coupled to a supply voltage (Vdd) or ground), from electrostatic discharge (ESD). In particular, the MEMS switch may be electrically coupled to the input pad and the control node in parallel with the transistor. In the absence of a voltage applied to a control terminal of the MEMS switch (for example, there may not be a voltage applied to the control terminal in the absence of the supply voltage, i.e., when the supply voltage is not applied to the interface circuit), the MEMS switch may be closed so that it electrically couples the input pad and the control node. (Thus, the default state of the MEMS switch is to electrically couple the input pad to ground, which is henceforth referred to as a 'normally grounded' configuration.) Moreover, when the voltage is applied to the control terminal of the MEMS switch (for example, by a control circuit), the MEMS switch is open so that the input pad and the control node are electrically decoupled.

In some embodiments, the MEMS switch includes two metal contacts separated by an intervening layer. This intervening layer may prevent metal-to-metal contact in the MEMS switch.

By using a MEMS switch having a 'normally grounded' configuration, i.e., electrically coupling the input pad and the control node (such as ground, the supply voltage, or both), the interface circuit may be protected from ESD. Moreover, the MEMS switch may offer improved ESD-protection capability in comparison with diodes, and may occupy significantly less area in the IC, thereby improving reliability and reducing cost.

In the discussion that follows, a MEMS switch that provides a reversible, virtual shunt to ground is used as an illustrative example of ESD protection in ICs. However, a wide variety of mechanical switches may be used in the interface circuit or disposed on an IC that includes the interface circuit, including nano-electromechanical system (NEMS) switches.

Figure 1:
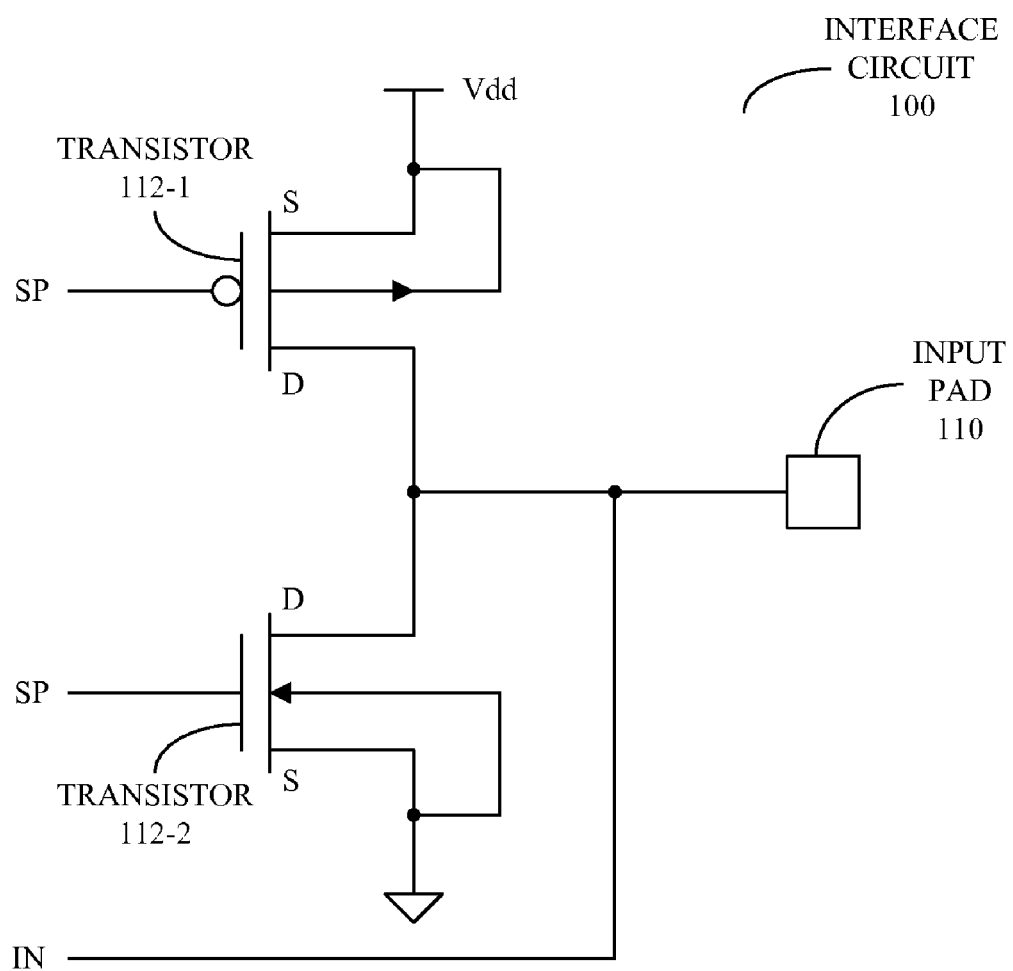
FIG. 1 is a block diagram illustrating an existing interface circuit.
Figure 2:
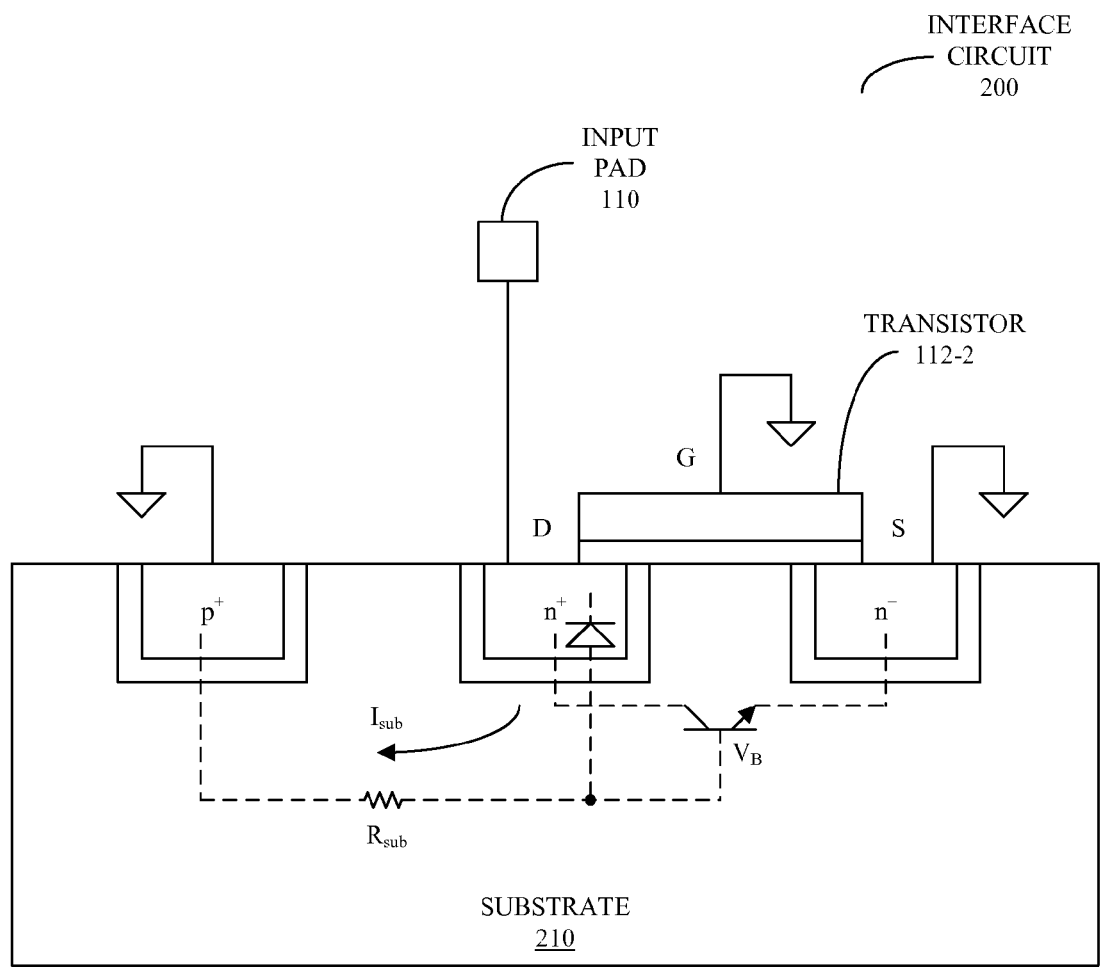
FIG. 2 is a block diagram illustrating parasitic effects in an existing interface circuit.
Figure 3:
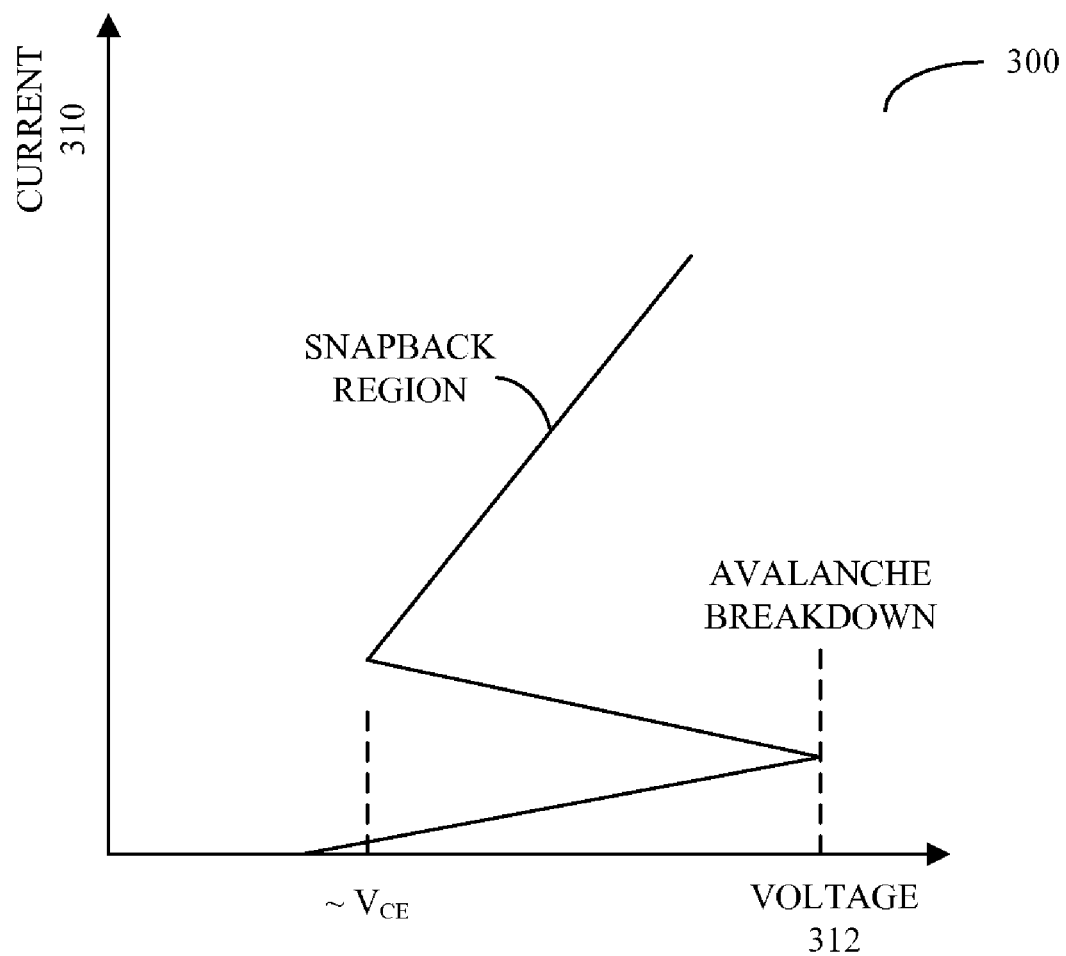
FIG. 3 is a graph of current as a function of voltage for an existing transistor.
Figure 4:
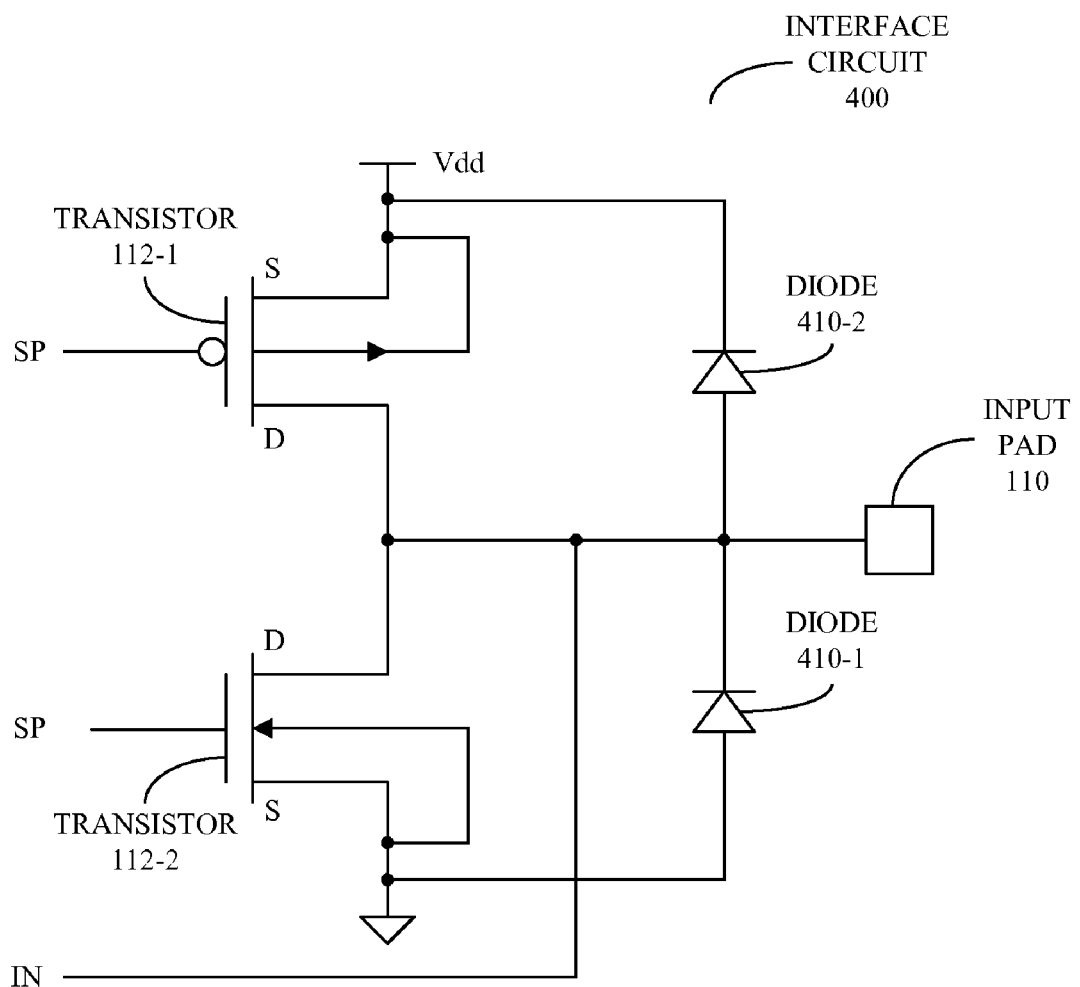
FIG. 4 is a block diagram illustrating an existing interface circuit.
Figure 5:
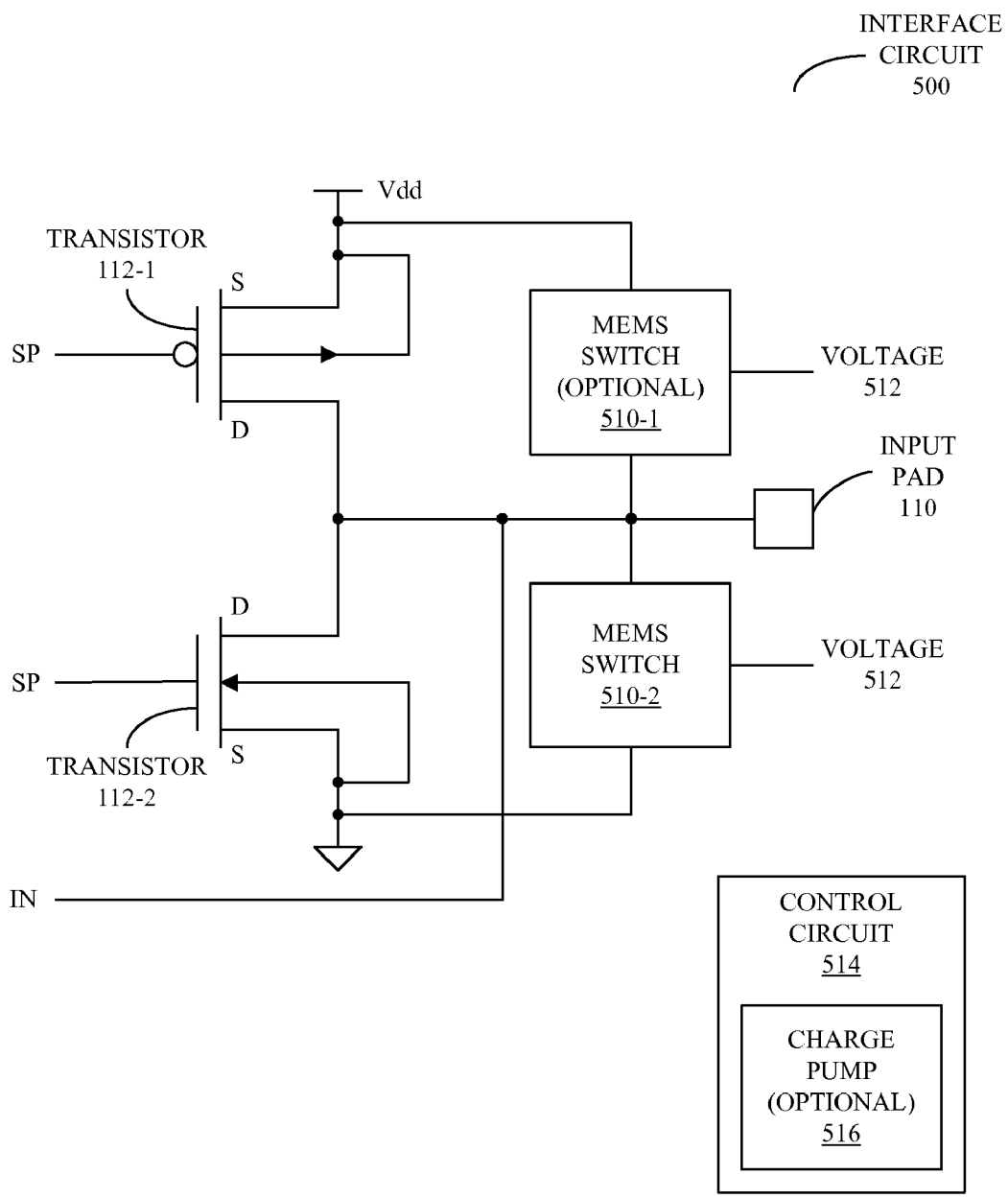
FIG. 5 is a block diagram illustrating an interface circuit in accordance with an embodiment of the present invention.

We now describe embodiments of the circuit that include the MEMS switch having the normally grounded configuration when the circuit is not functional, such as when the supply voltage and/or ground are not electrically coupled to the circuit, and which break this connection after the circuit is powered up. This is shown in FIG. 5, which presents a block diagram illustrating an interface circuit 500.

In this circuit, MEMS switch 510-2 shunts the drain and source terminals of n-type transistor 112-2, and optional MEMS switch 510-1 may shunt the source and drain terminals of p-type transistor 112-1. If an ESD event occurs, the current surge has a direct, low resistance path to the ground via MEMS switch 510-2, and the n-type transistor 112-2 is protected. (Similarly, MEMS switch 510-1 may protect p-type transistor 112-1.) Moreover, when voltage 512 (provided by control circuit 514) is applied to either of MEMS switches 510, the corresponding shunt is disconnected when the state of either of these switches is changed to open. For example, during initial power-up (when the IC that includes interface circuit 500 is first electrically coupled to the supply voltage and/or ground), MEMS switches 510 are moved to the open position by applying the voltage 512, thereby enabling normal operation of the interface circuit 500.

Note that the state of the MEMS switches 510 may be changed from closed to open once, a few times, or whenever the power to the interface circuit 500 is turned off. Thus, the MEMS switches 510 may be closed in the absence of the supply voltage applied to the interface circuit 500. For example, the MEMS switches 510 may be closed in the absence of voltage 512. However, in other embodiments the MEMS switches 510 may have two stable positions (open and closed), and the voltage 512 is only needed while changing the state, such as to open.

In some embodiments, voltage 512 is less than or equal to the supply voltage to interface circuit 500. However, in some embodiments voltage 512 may be greater than the supply voltage. For example, voltage 512 may be 7 or 10 V, and the supply voltage may be less than or equal to 5 V. Consequently, in some embodiments control circuit 514 includes optional charge pump 516.

Figure 6A:
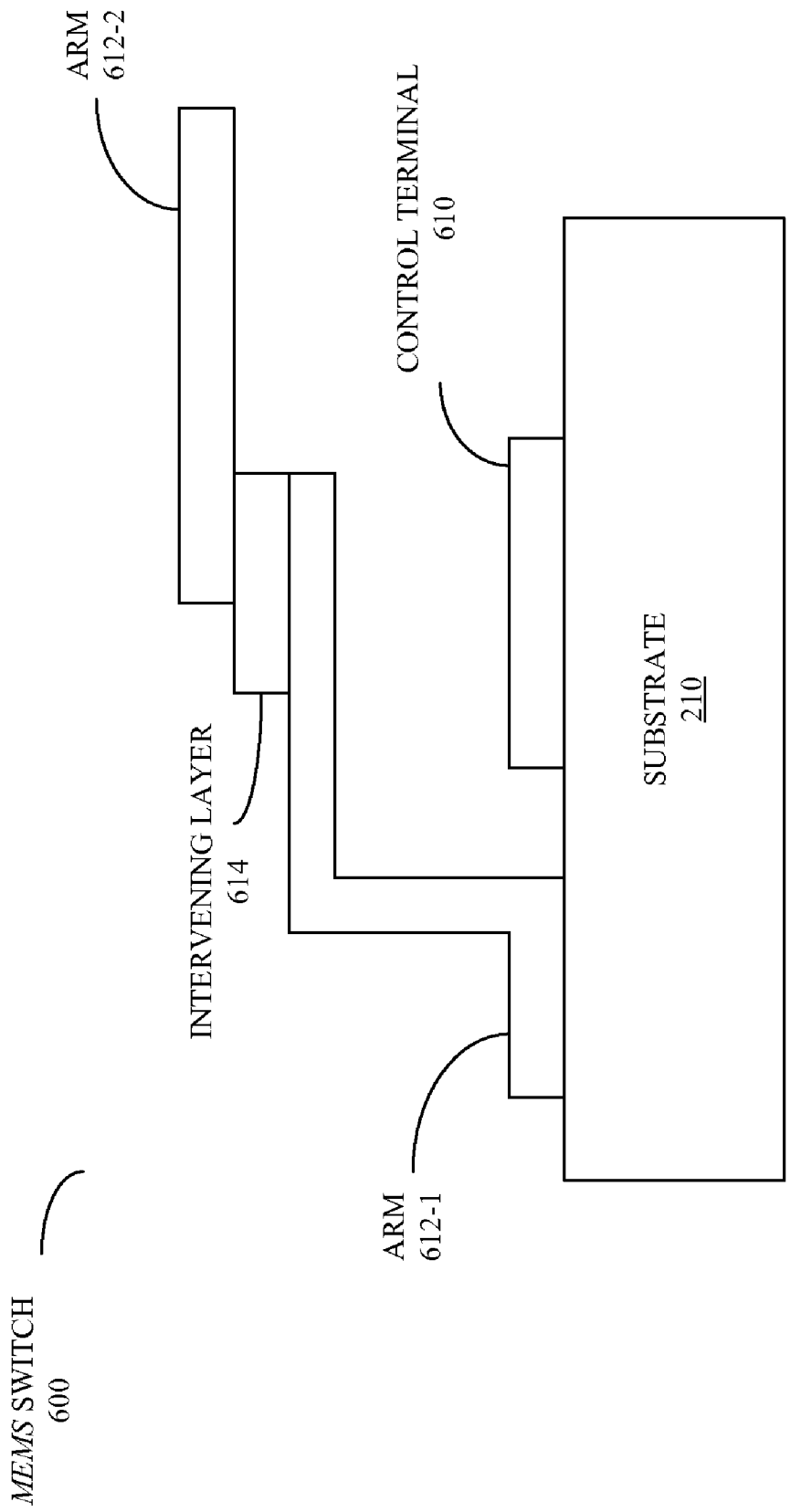
FIG. 6A is a block diagram illustrating a micro-electromechanical-system (MEMS) switch in accordance with an embodiment of the present invention.

A default or closed state of a MEMS switch is shown in FIG. 6A, which presents a block diagram illustrating a MEMS switch 600. In particular, this MEMS switch includes two metal arms 612 separated by intervening layer 614. (Note that an intervening layer may be included on either or both of the arms 612.)

Intervening layer 614 may prevent metal-to-metal contact when the MEMS switch 600 is closed, which allows the MEMS switch 600 to be opened by applying a voltage, such as voltage 512 (FIG. 5), to control terminal 610 if arm 612-1 is electrically coupled to the input pad and arm 612-2 is electrically coupled to the supply voltage or ground. This is shown in FIG. 6B, which presents a block diagram illustrating a MEMS switch 650.

Note that intervening layer 614 may be a good conductor (which is sufficient to carry the ESD current) that has a low (but finite) resistance, i.e., has a higher sheet resistivity than a metal. For example, this intervening layer may have a sheet resistivity less than $5\Omega/\square$ (ohms per square). Moreover, the intervening layer may have a sheet resistivity greater than $2\Omega/\square$. In some embodiments, the intervening layer includes: graphite, a salicided material, n-type silicon, p-type silicon, and/or doped poly-silicon. Note that intervening layer 614 may be fabricated using atomic-layer deposition and/or chemical vapor deposition.

In some embodiments, switch 650 includes metal contacts (such as copper) on arms 612. These metal contacts may be separated by a conductive, intervening layer (such as intervening layer 614) that is deposited on to one of the metal contacts. Moreover, this intervening layer may be 'non-stick' with respect to the other metal contact. For example, the intervening layer may be graphite which is deposited on top of a conductive titanium-nitride film. Note that the graphite layer may stick or adhere to the conductive titanium-nitride film but may not stick or adhere to the other metal contact (which may be or include copper).

Figure 6B:
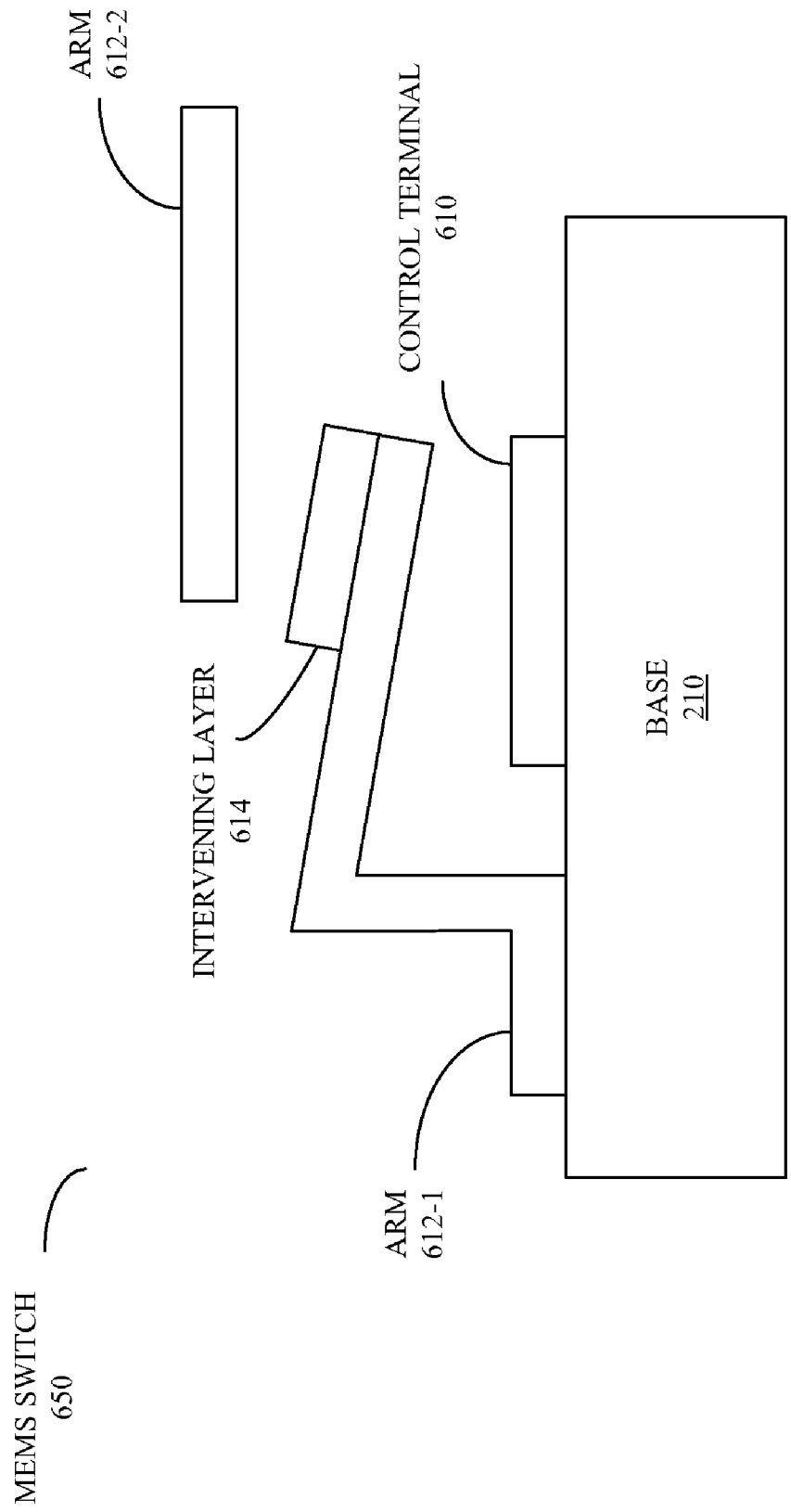
FIG. 6B is a block diagram illustrating a MEMS switch in accordance with an embodiment of the present invention.

While FIGS. 6A and 6B illustrate a cantilever-switch architecture, in other embodiments a membrane-switch architecture is used. Moreover, MEMS switches 600 (FIG. 6A) and 650 may have a vertical configuration, a horizontal configuration, or a combination of these configurations. Note that the vertical configuration is substantially aligned out of a plane of the interface circuit and the horizontal configuration is substantially aligned in the plane of the interface circuit.

In some embodiments, MEMS switches 600 (FIG. 6A) and 650 may be disposed, at least in part, in one or more metal layers of an IC. Moreover, MEMS switches 600 (FIG. 6A) and 650 may be fabricated using a variety of techniques, such as a negative process (in which material, such as a sacrificial layer, is removed) or a positive process (in which material is added), as is known to one of skill in the art. However, in other embodiments MEMS switches 600 (FIG. 6A) and 650 may be fabricated using a different process or in a different manufacturing facility than the IC which includes the interface circuit. Then, MEMS switches 600 (FIG. 6A) and 650 may be electrically coupled to the IC, for example, using a flip-chip package and/or a flexible cable.

In some embodiments, MEMS switches 600 (FIG. 6A) and 650 are designed to provide a narrow range of voltages (such as several volts) around voltage 512 (FIG. 5) that are needed to change the state. Moreover, MEMS switches 600 (FIG. 6A) and 650 may be designed to control: underdamped behavior (when the state is changed), arcing, and/or stiction. For example, surfaces of either or both of arms 612 may be roughened using a negative or a positive process.

ESD protection based on MEMS switches having a normally grounded configuration offers several advantages. In particular, the area cost is reduced relative to a diode-based solution. For example, a typical cantilever MEMS switch occupies an area of $1 \times 0.2 \, \mu m^2$, which is a small fraction of the n-type transistor area. Moreover, MEMS switches can be constructed on the interconnect layers instead of the active area. Thus, a MEMS switch can overlap with the n-type transistor of the interface circuit, resulting in significant area savings.

In addition, because the MEMS switch is normally grounded when the circuit is vulnerable to ESD (such as prior to installation in a device, or when the supply voltage and/or ground are disconnected), it provides instantaneous discharge of ESD.

Moreover, the MEMS switch may be able to withstand a much higher ESD voltage than a diode because of the metallic 'short' between the input pad and ground (or the supply voltage) when discharging ESD-induced current.

In some embodiments, interface circuit 500 (FIG. 5), MEMS switch 600 (FIG. 6A), and MEMS switch 650 include fewer or additional components. Moreover, two or more components may be combined into a single component and/or a position of one or more components may be changed.

We now describe embodiments of a method for protecting a transistor in an interface circuit from ESD. FIG. 7 presents a flowchart illustrating a method 700 for protecting a transistor in an interface circuit from ESD. During this method, two terminals of the transistor are electrically coupled to each other via a closed MEMS switch, which is in parallel with the transistor, in the absence of the voltage applied to a control terminal of the MEMS switch (710), where the closed MEMS switch electrically couples an input pad in the interface circuit to a control node. Then, the voltage is applied to the MEMS switch to open the MEMS switch, thereby electrically decoupling the two terminals of the transistor and electrically decoupling the input pad and the control node, when the supply voltage is provided to the interface circuit (712).

In some embodiments of method 700 there may be additional or fewer operations. Moreover, the order of the operations may be changed and/or two or more operations may be combined into a single operation.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
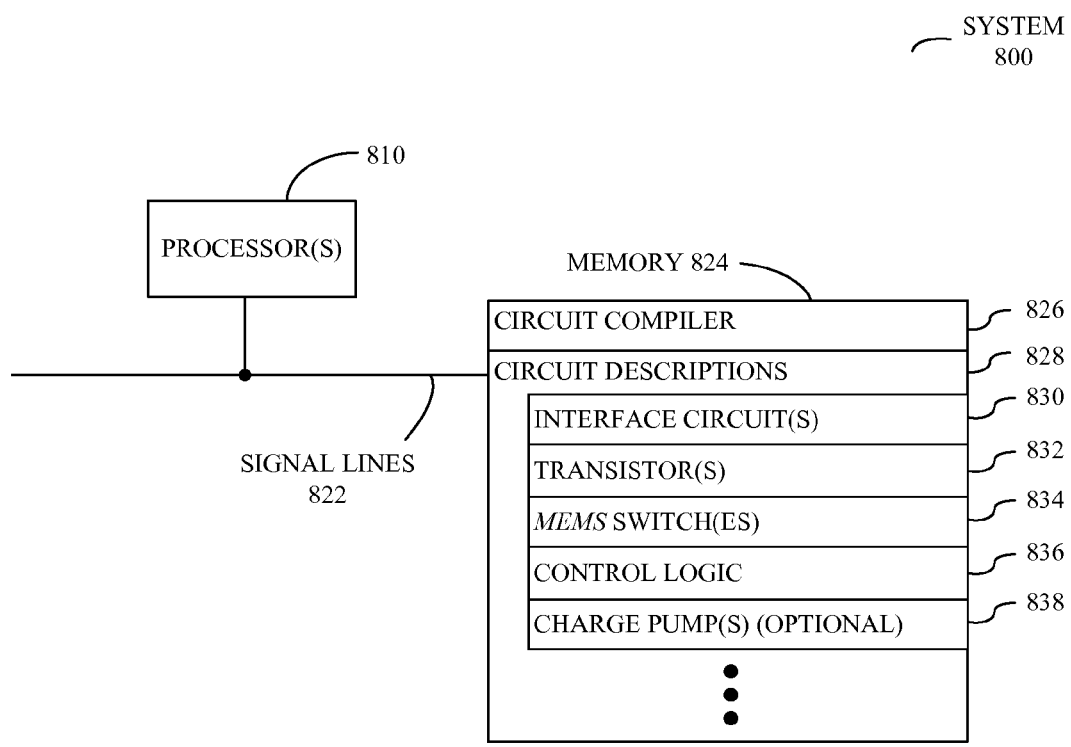
FIG. 8 is a block diagram illustrating a system in accordance with an embodiment of the present invention.

FIG. 8 presents a block diagram illustrating an embodiment of a system 800 that stores such computer-readable files. This system may include at least one data processor or central processing unit (CPU) 810, memory 824 and one or more signal wires or communication busses 822 for coupling these components to one another. Memory 824 may include high-speed random access memory and/or non-volatile memory, such as: ROM, RAM, EPROM, EEPROM, flash, one or more smart cards, one or more magnetic disc storage devices, and/or one or more optical storage devices.

Memory 824 may store a circuit compiler 826 and circuit descriptions 828. Circuit descriptions 828 may include descriptions of the circuits, or a subset of the circuits discussed above with respect to FIGS. 5, 6A and 6B. In particular, circuit descriptions 828 may include circuit descriptions of: one or more interface circuits 830, one or more transistors 832, one or more MEMS switches 834, one or more control logic 836, and/or one or more optional charge pumps 838.

In some embodiments, system 800 includes fewer or additional components. Moreover, two or more components may be combined into a single component and/or a position of one or more components may be changed.

While the preceding embodiments have used an interface circuit as an illustrative example, in other embodiments the MEMS switch is used to provide ESD protection to a wide variety of circuits, electronic devices, and ICs, which may be used in a myriad of applications.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An interface circuit, comprising:
an input pad and a control node;
a transistor having three terminals, wherein a first terminal is electrically coupled to the input pad and a second terminal is electrically coupled to the control node; and
a micro-electromechanical system (MEMS) switch, electrically coupled to the input pad and the control node, wherein the MEMS switch is in parallel with the transistor, and wherein the MEMS switch is configured to protect the transistor from electrostatic discharge (ESD);
wherein, in the absence of a voltage applied to a control terminal of the MEMS switch, the MEMS switch is closed, thereby electrically coupling the input pad and the control node, and, when the voltage is applied to the control terminal of the MEMS switch, the MEMS switch is open, thereby electrically decoupling the input pad and the control node.

2. The interface circuit of claim 1, further comprising a control circuit to provide the voltage.

3. The interface circuit of claim 2, wherein the control circuit provides the voltage when a supply voltage is provided to the interface circuit.

4. The interface circuit of claim 2, wherein the control circuit includes a charge pump.

5. The interface circuit of claim 1, wherein the voltage is greater than a supply voltage of the interface circuit.

6. The interface circuit of claim 1, wherein the control node is configured to electrically couple to ground or a supply voltage.

7. The interface circuit of claim 1, wherein the transistor is n-type.

8. The interface circuit of claim 1, wherein the interface circuit is disposed on an integrated circuit.

9. The interface circuit of claim 8, wherein the MEMS switch is disposed, at least in part, in a metal layer of the integrated circuit.

10. The interface circuit of claim 1, wherein the MEMS switch includes two metal contacts separated by an intervening layer.

11. The interface circuit of claim 10, wherein the intervening layer has a sheet resistivity less than $5\Omega/\square$.

12. The interface circuit of claim 11, wherein the intervening layer has a sheet resistivity greater than $2\Omega/\square$.

13. The interface circuit of claim 10, wherein the intervening layer prevents metal-to-metal contact in the MEMS switch.

14. The interface circuit of claim 10, wherein the intervening layer includes a salicided material.

15. The interface circuit of claim 10, wherein the intervening layer includes graphite.

16. The interface circuit of claim 10, wherein the intervening layer includes n-type silicon, p-type silicon, or doped poly-silicon.

17. The interface circuit of claim 1, wherein the MEMS switch includes a membrane-switch architecture or a cantilever-switch architecture.

18. The interface circuit of claim 1, wherein the MEMS switch has a vertical configuration or a horizontal configuration, wherein the vertical configuration is substantially aligned out of a plane of the interface circuit and the horizontal configuration is substantially aligned in the plane of the interface circuit.

19. The interface circuit of claim 1, wherein the MEMS switch is closed in the absence of a supply voltage applied to the interface circuit.

20. A computer-readable storage device, wherein the computer-readable storage device stores data which represents an interface circuit, and wherein the interface circuit includes:
an input pad and a control node;
a transistor having three terminals, wherein a first terminal is electrically coupled to the input pad and a second terminal is electrically coupled to the control node; and
a micro-electromechanical system (MEMS) switch, electrically coupled to the input pad and the control node, wherein the MEMS switch is in parallel with the transistor, and wherein the MEMS switch is configured to protect the transistor from electrostatic discharge (ESD);
wherein, in the absence of a voltage applied to a control terminal of the MEMS switch, the MEMS switch is closed, thereby electrically coupling the input pad and the control node, and, when the voltage is applied to the control terminal of the MEMS switch, the MEMS switch is open, thereby electrically decoupling the input pad and the control node.

21. An integrated circuit, comprising:
an interface circuit, wherein the interface circuit includes:
an input pad and a control node;
a transistor having three terminals, wherein a first terminal is electrically coupled to the input pad and a second terminal is electrically coupled to the control node; and
a micro-electromechanical system (MEMS) switch, electrically coupled to the input pad and the control node, wherein the MEMS switch is in parallel with the transistor, and wherein the MEMS switch is configured to protect the transistor from electrostatic discharge (ESD);
wherein, in the absence of a voltage applied to a control terminal of the MEMS switch, the MEMS switch is closed, thereby electrically coupling the input pad and the control node, and, when the voltage is applied to the control terminal of the MEMS switch, the MEMS switch is open, thereby electrically decoupling the input pad and the control node.

22. A method for protecting a transistor in an interface circuit from electrostatic discharge (ESD), comprising:

electrically coupling two terminals of the transistor to each other via a closed MEMS switch, which is in parallel with the transistor, wherein in the absence of a voltage applied to a control terminal of the MEMS switch, and in the absence of a supply voltage applied to the interface circuit, the MEMS switch is closed, and wherein the closed MEMS switch electrically couples an input pad in the interface circuit to a control node; and applying a voltage to the MEMS switch to open the MEMS switch, thereby electrically decoupling the two terminals of the transistor and electrically decoupling the input pad and the control node, wherein the voltage is applied to the MEMS switch when a supply voltage is provided to the interface circuit.

\* \* \* \* \*